United States Patent [19]

Riha

[11] Patent Number: 4,484,160
[45] Date of Patent: Nov. 20, 1984

[54] ELECTRONIC COMPONENT OPERATING WITH ACOUSTIC WAVES

[75] Inventor: Gerd Riha, Munich, Fed. Rep. of Germany

[73] Assignee: Siemens Aktiengesellschaft, Berlin & Munich, Fed. Rep. of Germany

[21] Appl. No.: 472,980

[22] Filed: Mar. 8, 1983

[30] Foreign Application Priority Data

Mar. 18, 1982 [DE] Fed. Rep. of Germany ....... 3209962

[51] Int. Cl.$^3$ .................... H03H 9/64; H03H 9/145
[52] U.S. Cl. .............................. 333/195; 310/313 D; 333/153; 333/196
[58] Field of Search .................. 333/150–156, 333/193–196; 310/313 R, 313 B, 313 C, 313 D; 364/821

[56] References Cited

U.S. PATENT DOCUMENTS

| | | | |
|---|---|---|---|
| 3,813,618 | 5/1974 | Hartemann et al. | 333/193 |
| 4,427,954 | 1/1984 | Veith et al. | 333/196 X |
| 4,429,246 | 1/1984 | Miyajima | 333/195 X |

OTHER PUBLICATIONS

R. E. Chapman et al., "Weighted In-Line Reflective Array Devices", 1979 Ultrasonics Symposium, pp. 696–700.

T. Kitano et al., "Amplitude Weighted Metal Strip Reflective Array Compressor", 1977 Ultrasonics Symposium, pp. 585–589.

*Primary Examiner*—Marvin L. Nussbaum
*Attorney, Agent, or Firm*—Hill, Van Santen, Steadman & Simpson

[57] ABSTRACT

Electronic components which operate with acoustic waves are provided as interdigital structures and/or reflective arrangements. An oscillating displacement of the significant plurality of sub-groups is provided parallel to the principal axis of propagation in a weighted region, each sub-group having at least two successive real finger edges and, under certain conditions, virtual finger edges. A plurality of principal groups is provided and in a number which is equal to or greater than the time/bandwidth product. Each principal group has at least two real sub-groups and the respective degree of displacement of the finger edges of the individual sub-group corresponds to an additional oscillating phase modulation for the sequence of the sub-groups of the weighted region with the oscillation being such that the number of oscillations within a principal group is a whole number which is not greater than half the number of the sub-groups therein.

16 Claims, 8 Drawing Figures

ELECTRONIC COMPONENT OPERATING WITH ACOUSTIC WAVES

BACKGROUND OF THE INVENTION

1. Field of the Invention

The present invention relates to an electronic component which operates with acoustic waves as an interdigital structure and/or "reflective array" arrangement having an input and an output transducer and with, under certain conditions, at least one reflector structure. At least one of the structures has at least one weighted region of the fingers of the structure.

2. Description of the Prior Art

Numerous embodiments of the electronic components are known from the prior art which operate with acoustic waves and which are employed as electrical frequency filters, signal generators, oscillators and the like. As a rule, these components have at least one input transducer and at least one output transducer which, depending upon the embodiment, can also coincide operationally to form one transducer. Such transducers can have the format of an interdigital structure including meshing electrode fingers.

Of significance are embodiments of such an electronic components which, in addition to the input transducer and the output transducer, also have one or more reflector structures which likewise comprise a respective multitude of fingers or, respectively, digit strips or, respectively, configurations corresponding thereto. There are "in-line" reflector structures (normal incidence) wherein 180° reflection at the fingers occurs in the reflector structure. Other such reflector arrangements have two or more reflector structures disposed next to one another whereby the fingers of one reflector structure are disposed at an angle of approximately 90° relative to the fingers of another reflector structure (oblique incidence).

An electronic component of the types set forth above can be dimensioned such that it executes a signal processing corresponding to a prescribed transfer function and emits the output signal corresponding to that function. Thereby dimensioned are the finger spacing and the weighting of the individual fingers, whereby a changing finger spacing is provided for filters having a dispersive property. As known, the mathematical determination of the required dimensioning is carried out by forming the Fourier transform of the transfer function. The Fourier transform is also referred to as the filter pulse response. It can be represented as a complex function $$s(t) = a(t) \cdot e^{j[\omega_0 t + \varphi(t)]}.$$

For $a(t) \neq$ constant, this function requires at least one weighted digital structure in the component. The weighting of a digit structure or, respectively, of the individual fingers of the structure is a designational reduction of the mechanical or, respectively, electromechanical efficiency of the fingers of the structure. Known in this regard for an interdigital structure is to have the mutually-adjacent electrode fingers situated at mutually-different potentials overlap one another to different degrees. Given high weighting, a topical overlap which is now only very slight occurs, this leading to disadvantageous wave diffractions.

In addition to the usually very disadvantageous measure of a more or less pronounced shortening of a respective finger, the measure also exists for reflector structures of replacing a finger (unweighted) designed as a through strip with a series of individual points (referred to as "dots") corresponding to the strip. The density and/or size of the "dots" dimensioned larger or smaller corresponds to a more or less shortened and, therefore, weighted finger (and such a respective structure replacing a finger is also referred to herein as a finger or digit strip). Disadvantageous in such an execution is that the "dots" cause noise signals due to the undesired reflection and scatter behavior (particularly given a higher weighting, i.e. a lower density of the "dots"). The original embodiment of weighted fingers in a reflector structure consists of realizing such fingers as grooves in the surface of the substrate and to make such a groove deeper or shallower corresponding to the weighting. This technology, in turn, has the disadvantage that it is extraordinarily expensive and is difficult to control.

In connection with the above, one may refer to the 1979 Ultrasonic Symposium Proceedings IEEE, pp. 696–700 of Chapman and of Kitano at pp. 585–589 of the same publication and 1976 Ultrasonic Symposium Proceedings IEEE, pp. 406–410 of Godfrey, all of which are fully incorporated herein by this reference.

SUMMARY OF THE INVENTION

An object of the present invention is to provide a technological execution of the weighting of the fingers of a digit structure, particularly employed for a reflector structure, which is less involved and can be more easily controlled (for example, in comparison to weighting by way of grooves with varying depths) and/or leads at most to minimum disruptions (for instance, in comparison to a weighting with "dots"), or, respectively, to provide such for an electrode finger structure which exhibits no defraction effect induced thereby, even given higher weightings.

The above object is achieved, according to the present invention for an electronic component of the type generally set forth above in that an oscillating displacement $\Delta Z$ of a significant plurality of sub-groups is providedparallel to the principle axis Z of the wave propagation in a weighted region, in comparison to that case in which the region would be unweighted. In this structure each individual sub-group has at least two successive, real finger edges and, under certain conditions, further virtual finger edges. A plurality of n principle groups is present, where n is equal to or greater than T·B, where T·B is the time/bandwidth product and where T is the prescribed duration of the filter pulse response and B is the prescribed bandwidth of the transfer function. Each individual principle group has at least two real sub-groups. The respective degree of the displacement of the finger edges of the respective individual sub-group corresponds to an additional oscillating phase modulation b(t) for the sequence of the sub-groups of the weighted region and the phase modulation b(t) oscillates such that the plurality of oscillations within a principle group is an integer which is not greater than half the plurality of the real sub-groups contained in the principle group. With this structure, the relationship $$\overline{e^{jb(t)}} \approx a(t)/r(t)$$

applies, wherein $\overline{e^{jb(t)}}$ is the average of the e function over a principle group approximately equal to the ratio $a(t)/r(t)$, where $a(t)$ is the prescribed amplitude modulation of the filter pulse response, r(t) is equal to or greater than a(t) and is valid for all values of t. The degree of the displacement $\Delta Z_i$ of the finger edges of a respective $i^{th}$ sub-group at its location $Z_i$ of its center is $$\Delta Z_i = \lambda_i / 2\pi \cdot b(t_i),$$

wherein $t_i = Z_i/V$, where Z is the coordinate of the principle direction of the wave propagation with the velocity v and $\lambda_i$ is the wavelength at the location of the $i^{th}$ sub-group.

The present invention is based on the following considerations and perceptions.

Over the frequency entered on the abscissa 2, FIG. 1 illustrates the prescribed amplitude curve 1 of a transfer function (the amplitude being entered on the ordinate 3). With a broken-line curve 4 (to which the envelope delay time is entered on the ordinate), FIG. 1 additionally illustrates the prescribed curve of the envelope delay time $\tau(f)$ of the overall required transfer function of the component of the present invention operating with acoustic wave and appertaining to the prescribed amplitude curve 1. The illustrated transfer function is an example as typically occurs in chirp modulation filters. This transfer function comprises the two curves 1 and 4 and corresponds to a specific Fourier transform which is the time-dependent filter pulse response:

$$s(t) = a(t) \cdot e^{j[\omega_0 t + \varphi(t)]}. \qquad (I)$$

For the purpose of dimensioning the fingers according to the present invention (for simplification the filter response is essentially realized by only one finger structure), this expression is converted into the following form in which the function s(t) occurs from the convolution integral with the function $\tilde{s}(t)$:

$$s(t) = \{r(t) \cdot e^{j[\omega_0 t + \varphi(t) + b(t)]}\} * g(t) \qquad (II)$$

$$= \tilde{s}(t) * g(t)$$

In this representation, the amplitude function a(t) has been transformed into the phase function b(t) which is correspondingly decisive for the dimensioning, according to the present invention, of the shift of finger edges for the purpose of weighting the appertaining structure. The weighting a(t) to be realized in accordance with the invention occurs from the transfer function prescribed for the appertaining component, deriving according to the amplitude 1 and the envelope delay time 4 thereof.

This mathematical transformation of s(t) into $\tilde{s}(t)$ is accompanied by the appearance of the expression r(t) and of the convolution function g(t). The function r(t) is the envelope of the digital structure not equipped with the additional phase weighting of the present invention. For the sake of completeness, it should be pointed out that the function r(t) can also contain an additional amplitude modulation which would have to be realized, given a component according to one of the known methods of finger weighting, for example, one of the methods described above. The convolution function g(t) essentially represents the filter pulse response of an input and/or output transducer given an interdigital structure or, respectively, given an "in-line" reflector structure, or it corresponds to the convolution-like integration (filtering) inherent in the aperture of a reflector structure having obliquely-located reflector fingers, i.e. having double 90° reflection. The function g(t) with the modified function of the present invention, namely the function $\tilde{s}(t)$ as in equation II. This operation mathematically referred to as convolution corresponds, in the frequency range (of the illustrated FIG. 1) to side bands being filtered out. Such side bands occurring in conjunction with the present invention are illustrated in FIG. 1 with a dotted curve and a referenced 5.

The side bands 5 are filtered out in conjunction with the present invention, in particular, predominantly by way of corresponding dimensioning of the input transducer and/or of the output transducer. As likewise already stated above in different terms, this can be achieved for the reflector structure having oblique fingers by selecting a correspondingly large aperture value, i.e. correspondingly long fingers of the structure. Only for the sake of completeness, it should also be pointed out that this filtering can also occur outside of a component constructed in accordance with the present invention, for example, in further modules of an overall device having a filtering effect. Because of the very simple possibility of filtering such side bands 5 offered by a component constructed in accordance with the present invention, however, the latter possibility is seldom employed.

In order to realize the modified function $\tilde{s}(t)$ according to equation II, finger edges of a digital structure constructed in accordance with the present invention are oscillatingly displaced (with a minimum frequency), in particular, relative to a topical position (in the structure) which would derive for a corresponding digital structure if this had no weighting at the appertaining location of the respective finger edge, i.e. if the fingers were unweighted at that point. In an unweighted, non-dispersive digital structure, for example, the fingers and, therefore, their finger edges as well, are disposed at equi-distant intervals, for example, in $\lambda_o/2$ intervals given interdigital arrangements (without "split fingers") and in "in-line" reflector structures and at intervals $\lambda_o$ given a reflector structure having oblique fingers and double 90° reflection, in particular, measured parallel to the principle axis or, respectively, normals of the wave front of the acoustic wave.

The displacement of the finger edges provided by the present invention occurs in accordance with the function b(t) which will be discussed below, in particular, group-wise for the finger edges. A respective plurality of finger edges is combined into individual sub-groups, i.e. the same degree of displacement in terms of amount and direction applies to all finger edges of a respective sub-group. A multitude of sub-groups is present in a weighted region of a digital structure constructed in accordance with the invention. Each individual sub-group has at least two real finger edges, but can also comprise a greater plurality of finger edges. These further finger edges can be real and virtual finger edges. A real finger edge is an edge of a finger or, respectively, of a digit strip such as is actually present in the structure, for example, as a metallization strip. A virtual finger edge, however, in the sense of the present invention, is a finger edge of a finger or digit strip which is omitted in the structure. In particular, it is not necessary for a digital structure that it be provided with a maximally-possible plurality of fingers or, respectively, digit strips in accordance with the wave length of the center frequency. As known, a digital structure also has the corresponding effect when a larger or smaller plurality of fingers is omitted (thinned digital structure).

The definition of a sub-group set forth above contains, among other things, the possibility that it consists of two real finger edges, whereby two real finger edges belong to one and the same finger (fingers). A further possibility is that it again consists of two real finger edges whereby, however, these two finger edges are the mutually-neighboring finger edges of two adjacent fingers. The boundary between two adjacent sub-groups, accordingly, extends through a finger. A sub-group can, for example, also comprise three real finger edges, such sub-group encompassing the complete finger and half of a neighboring finger whose other half belongs to the next sub-group. When, for example, every second finger is omitted in an appertaining digital structure, then a smallest sub-group comprises four finger edges, in particular, two real edges and two virtual edges, i.e. of a complete finger or of two halves of respective fingers with an intervening omitted finger.

According to the invention, a plurality of sub-groups is combined into a respective principle group for the dimensioning of the finger edge displacement. Each individual principle group contains at least two real sub-groups, i.e. sub-groups actually represented in the structure by fingers. The rule applies to these two sub-groups of a respective principle group that the finger edges of the one sub-group are displaced opposite (towards or away from) the finger edges of the other sub-group. Other possibilities exist for a principle group having more than two sub-groups; therefore, for example, given three sub-groups the center sub-group remains undisplaced and only the finger edges of the one outer sub-group are displaced relative to those of the other. In a principal group comprising four sub-groups, for example, one or two sub-groups can remain displaced. The amounts of displacement of the real sub-groups of a principal group (having more than two real sub-groups) need not be identical. However, the sum of the displacements of all sub-groups of such a principal group must be equal to zero, leaving out of consideration that, given different finger intervals, the dimension of the finger interval distances (as a very slight correction value) enters due to a prescribed dispersion or, respectively, non-constant group delay time and/or leaving out of consideration that fingers of a respective sub-group have differing electro-mechanical (interdigital transducer) or, respectively, mechanical reflector) efficiencies and/or that their plurality differs.

A rule concerning the minimum plurality n of principal groups also applies for practicing the invention, in particular, n must be at least equal to or greater than the time/bandwidth product (T·B), wherein T is the duration of the filter pulse response and B is the bandwidth of the prescribed transfer function (v. FIG. 1.).

As was already mentioned above, further specifics concerning the function of the additional phase modulation b(t) are to be provided. The relationship $$e^{jb(t)} \approx a(t)/r(t) \quad \text{III}$$

holds true wherein $e^{jb(t)}$ is the average of the function e over a principal group.

An envelope a(t) which differs from the constant, causes a weighting of the amplitude 1 of the transfer function, in particular, for a realization of the structure having fingers or, respectively, digital strips.

It is advantageous when the necessarily occurring side bands overlap, at most insignificantly with the required principal band. This is achieved, in particular, by the selection of the additional phase modulation b(t), so that the plurality of oscillations contained in the respective principal group is equal to half the real sub-groups contained in the principal group.

SUMMARY OF THE INVENTION

Other objects, features and advantages of the invention, its organization, construction and operation will be best understood from the following detailed description taken in conjunction with the accompanying drawings, on which:

DESCRIPTION OF THE PREFERRED EMBODIMENTS

Figure 1:
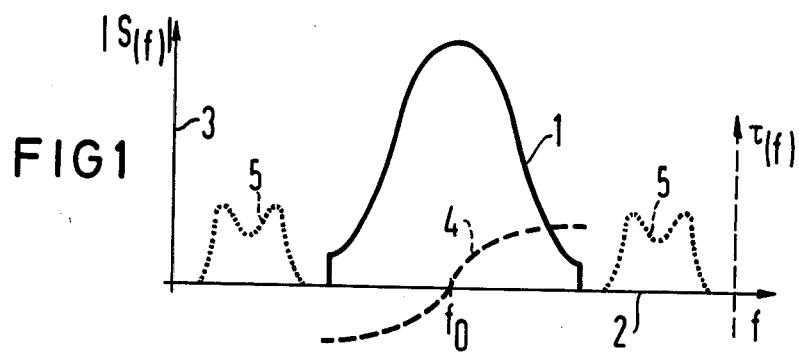
FIG. 1 is a graphic illustration of a curve of a prescribed transfer function which is to be realized in practicing the present invention.

The transfer function has already been discussed above with respect to FIG. 1 in terms of magnitude 1 and envelope delay time 4.

Figure 2:
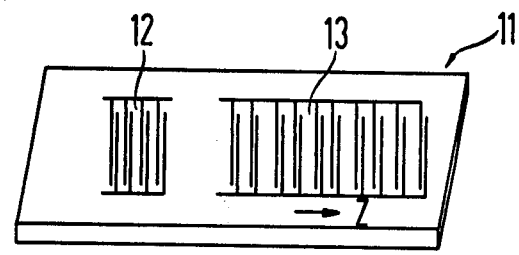
FIG. 2 is a schematic representation of a component constructed in accordance with the present invention as an interdigital structure.

Referring to FIG. 2, a component 11, constructed in accordance with the present invention, is an interdigital structure comprising an input transducer 12 and an output transducer 13. The input transducer 12 has a conventional structure. In particular, the spacings of the individual fingers of the transducer 12 are mutually equidistant and $=\lambda_0/2$. The transducer 13, on the other hand, is designed in accordance with the present invention. The finger weighting of the transducer 13, which would be executed in a conventional manner by different lengths of the individual fingers, is realized here by a displacement $\Delta Z$, according to the invention, of the individual fingers of a respective sub-group, whereby all fingers have the same length in general. An additional weighting could be provided wth a slighter or greater difference in finger length, this weighting, however, having nothing at all to do with the present invention. By way of a correspondingly large displacement $\Delta Z$ of the fingers and, therefore, of the finger edges of the individual sub-groups, one can also realize a very high weighting without defraction effects occurring, these, in particular, occurring given finger length weighting when the overlap of adjacent fingers remains only very small in accordance with high weighting.

The terminals of the transducers 12 and 13, the substrate on which the transducers are located, the end edges of the substrate body slanted in the direction $\pm Z$ and further details not affecting the invention are of conventional design and it is therefore not necessary to discuss the same in further detail herein.

Figure 3:
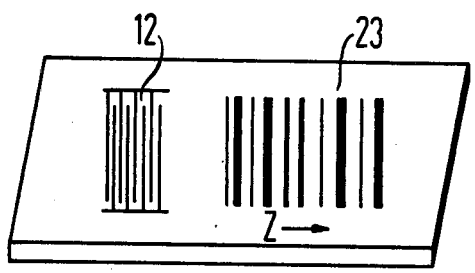
FIG. 3 is a schematic representation of a component constructed in accordance with the invention as an "in-line" reflector.

The "in-line" reflector illustrated in FIG. 3 comprises a transducer 12 which serves as an input transducer and an output transducer. In practically all structural details, it can correspond to the transducer 12 of FIG. 2. Even given the embodiment according to FIG. 3, the transducer 12 can be so broadband that it does not influence the overall required transfer function 1. A reflector design in accordance with the present invention is illustrated at 23 and comprises individual digit strips which are usually of equal length. In accordance with conventional methods, one would realize the weighting of such a reflector by way of correspondingly different depths of the etched grooves or by way of a greater or lesser density of "dots" (namely with the disadvantages set forth above). Given the present invention, however, the digit strips of the structure 23, i.e. the finger edges of the digit strips to be more precise, are displaced by the respective dimension $\Delta Z$. For a non-dispersive digital structure 23, the displacement $\Delta Z$ occurs as a displacement relative to an equidistant finger center-to-center spacing. When the digital structure 23 has a dispersion, then it already has non-equidistant finger center-to-center spacings even in the unweighted condition on which the same modulated respective displacement $\Delta Z$ of the individual finger edges is then superimposed.

Whereas an embodiment of the invention is illustrated for the transducer 13 according to FIG. 2 wherein the fingers or, respectively, digit strips continue to retain mutually identical widths and only have different spacings from one another (whereby individual fingers are also omitted as virtual fingers), the illustration of FIG. 3 shows fingers or, respectively, digit strips which exhibit different widths. These different widths derive from the displacement of the finger edges whereby, for individual fingers, the two edges of the individual finger are displaced towards one another (narrower fingers) and, given other individual fingers, the two edges of such a finger are displaced away from one another (broader fingers).

Figure 4:
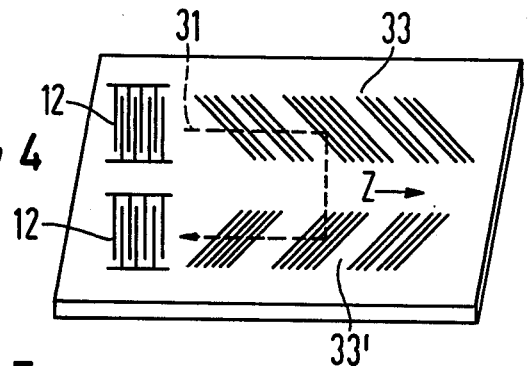
FIG. 4 is a schematic representation of a component constructed in accordance with the invention as a 90° reflector.

FIG. 4 illustrates what is meant to be understood by a 90° reflector. Such a component according to the present invention also has an input transducer 12 and an output transducer 12 which can be identically designed. An example of a wave path is indicated with a broken line 31. A respective reflection occurs in the reflector 33 and in the reflector 33' which both have oblique disposed reflector fingers. The principal wave direction or, respectively, abscissa of the displacement $\Delta Z$ of the fingers of the structures 33 and 33' is again indicated with the arrow Z. The two structures 33, 33' have virtual fingers, i.e. corresponding fingers are omitted at gaps. Given these structures according to FIG. 4, the weighting of the structures 33, 33' also comprises finger edge displacement $\Delta Z$. As a rule, the fingers of the structures 33, 33' are of equal length for each of the structures and, in particular, also for the structures among one another.

The aforementioned aperture of such a structure is the projection of the actual finger length onto the normal and the abscissa Z, i.e. is equal to the width of the individual structures 33, 33'.

For the sake of completeness, it should be pointed out that the displacement $\Delta Z$ offered by the present invention is measured parallel to the abscissa Z, i.e., is measured in a direction oblique relative to the finger direction. The explanations provided concerning the following figures relate to fingers or, respectively, finger edges aligned perpendicular to the abscissa Z. These explanations below accordingly apply by analogy for obliquely-placed fingers or, respectively, finger edges as well, as occur in the structures 33, 33'.

Figure 5:
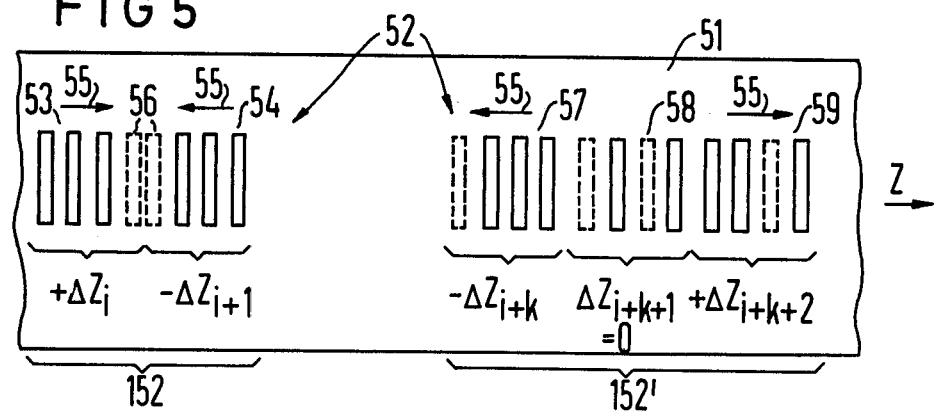
FIG. 5 is a schematic representation of a portion of a component constructed in accordance with the present invention, showing two principal groups of a digital structure.

On a substrate shown broken off at both ends along the direction Z, FIG. 5 schematically illustrates a portion of a digital structure 52 designed in accordance with the present invention, i.e. a weighted digital structure 52 according to the invention. A plurality of real and virtual sub-groups follow one another from the left towards the right, i.e. in the direction Z. The first sub-group as viewed from the left is referenced 53 and the next sub-group is referenced 54. In accordance with the arrows 55, the finger edges and, therefore, the fingers of these two sub-groups 53 and 54 are displaced towards one another. The degree of the displacement is indicated by the mathematical expressions below the sub-groups 53 and 54. The displacement $\Delta Z_i$ applies to each finger edge of the sub-group 53, is directed towards the right, and, moreover, is also a function of the locus coordinate $Z_i$ (the center of the sub-group 53). The analogous case applies to the sub-group 54. The digit strips illustrated with solid lines are real fingers having real finger edges. Shown with broken lines and referenced 56 are two finger locations, i.e. virtual fingers being indicated, which are in fact not present on the structure. These two fingers are advantageously omitted because, as can be seen from the drawing, their spacing from one another is greatly reduced by the mutually opposing displacement $\Delta Z$ of the two sub-groups 53 and 54. Such a spacing between two fingers which has become very small, in particular, creates substantial problems when such a structure is an interdigital structure wherein, as illustrated in FIG. 2, mutually-adjacent fingers lie at mutually-different electrical potential and causes a modulation of the electric field between and/or electrical arcing becomes very probable. Three further sub-groups following one another towards the right are referenced 57, 58 and 59. The spacing between the sub-group 54 and the sub-group 57 provides an indication of at least one virtual sub-group, such that (k-2) real sub-groups are lacking at that location, i.e. the corresponding plurality of virtual sub-groups is to be assumed.

As illustrated, the finger edges of the fingers of the sub-group 57 are displaced towards the left, those of the sub-group 59 are displaced toward the right and those of the sub-group 58 are not displaced.

Together, the sub-groups 53 and 54 form a principal group 152. In this principal group, the overall displacement $+\Delta Z_i$ and $-\Delta Z_{i+1}$ is essentially equal to zero. The analogous case applies to the principal group 152' which is formed by the sub-groups 57, 58 and 59.

The individual principal groups correspond to the required minimum plurality n of principal groups and follow one another along the abscissa Z. The sub-groups which form the individual principal groups form a corresponding sequence of groups.

Figure 6:
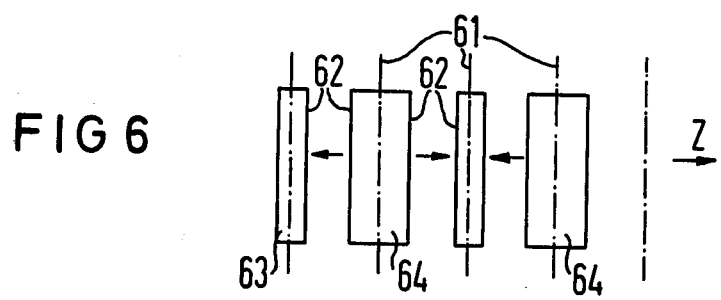
FIG. 6 is a schematic illustration of a finger edge displacement which produces alternating finger widths.

FIG. 6 illustrates a section of a particular embodiment of the invention. The boundaries of neighboring sub-groups are identified with broken straight lines 61. As can be seen, each sub-group has two finger edges 62 which, however, belong to different fingers. The boundaries 61, therefore, extend through the individual fingers so that narrow fingers 63 and broad fingers 64 follow in alternation. The displacement $\Delta Z$ of the individual finger edges 62 corresponds, in terms of amount, to its topical displacement in the direction Z relative to that position of the finger edges of a comparable structure having fingers of mutually-identical width which would have no weighting corresponding to the finger edge displacement.

Figure 7:
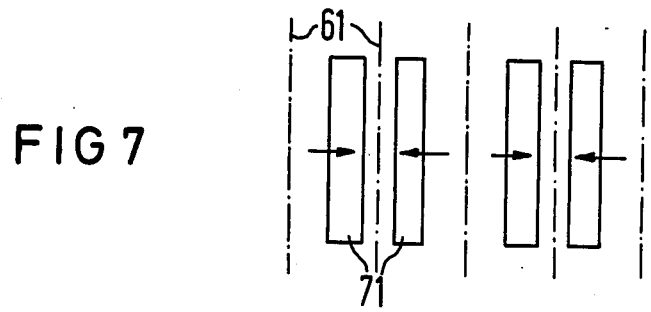
FIG. 7 is a schematic representation of a finger edge displacement which leaves the finger width unaltered.

FIG. 7 illustrates a device wherein the boundaries 61 of neighboring sub-groups lie between neighboring (real or virtual) fingers. In the embodiment of FIG. 7 as well, each individual sub-group has only two finger edges which (in contrast to FIG. 6), however, belong to one and the same finger 71. In contrast to the unweighted case, the finger width here remains constant. As can be seen, however, the adjacent fingers are alternately displaced towards one another or away from one another. The respective degree of approach or distancing of the fingers 71 from one another, just as with the broadening and narrowing of the fingers according to FIG. 6, depends on the weighting required at the respective location of the digital structure.

Figure 8:
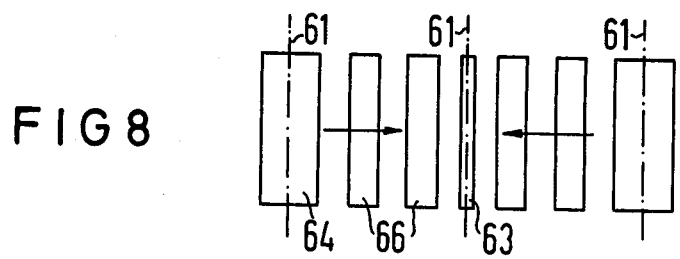
FIG. 8 is a schematic illustration of a finger edge displacement which is a combination of the displacements illustrated in FIGS. 6 and 7.

FIG. 8 indicates an embodiment of the invention wherein the two illustrated sub-groups between the boundary 61 comprise six respective finger edges. As seen in FIG. 6, the boundary 61 extends through individual fingers. The illustration shows how broader fingers 64, very narrow fingers 63 and fingers 66 with unaltered width thereby occur. Should the realization of a finger 63 as illustrated in FIG. 8 present technological difficulties, particularly because it has become extremely narrow, such a finger can also be omitted without causing any disadvantage, i.e. can be a virtual finger.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An electronic component operating with acoustic waves, comprising:
   a substrate;
   at least one electromechanical transducer carried on said substrate;
   at least one finger structure carried on said substrate;
   at least one of said finger structures comprising at least one region in which fingers are weighted;
   at least one of said finger weighted structures comprising in said region a plurality of such spaced principal groups extending in a direction Z along the principal axis of wave propagation in said weighted region, each of said principal groups in said region comprising at least two subgroups; said sub-groups extending in said direction Z;
   each of said sub-groups comprising at least two successive real finger edges and at least an essential number of said sub-groups having an oscillating displacement $\Delta Z$; the number n of all principal groups of the respective finger structure being equal to or greater than T·B, where T·B is the time bandwidth product, with T being the predetermined duration of the predetermined pulse response and B being the predetermined bandwidth of the transfer function of said respective finger structure;
   the respective amount of displacement $\Delta Z_i$ of the finger edges of the $i^{th}$ individual sub-group, said $i^{th}$ sub-group belonging to a respective sequence of sub-groups of said weighted region, is determined by an additional oscillating phase modulation b(t) predetermined for said sequence, wherein said phase modulation b(t) being such that the number of oscillation within each individual principal group of said sequence is an integer which is not greater than half the number of sub-groups of said principal group;
   whereby the relationship $$\overline{e^{jb(t)}} \approx a(t)/r(t)$$

holds true, where $e^{jb(t)}$ is the average of the function e over said individual principal group and approximately equal to a(t)/r(t), where a(t) is the predetermined amplitude modulation of said pulse response, and r(t) is equal to or greater than a(t) for all values of t;
   and
   the amount of displacement $\Delta Z_i$ of the finger edges of a respective $i^{th}$ sub-group at its center $Z_i$ is $$\Delta Z_i = (\lambda_i/2\pi) \cdot b(t_i),$$

where $t_i = Z_i/v$, where Z is the direction of wave propagation with a velocity v and $\lambda_i$ is the local constructive wave length at the location of the $i^{th}$ sub-group.

2. The electronic component of claim 1, wherein said finger structure with said weighted region is an interdigital structure including finger edges with said displacement $\Delta Z_i$.

3. The electronic component of claim 1, wherein said finger structure is a reflector structure including finger edges with said displacement $\Delta Z_i$.

4. The electronic component of claim 1, wherein some of said sub-groups comprise virtual fingers in addition to the real fingers.

5. The electronic component of claim 1, and further comprising:
   an additional interdigital structure on said substrate comprising a convolution function g(t).

6. The electronic component of claim 1, wherein at least one of said finger structures is a 90° reflector structure including a reflector aperture dimensioned to provide the convolution function g(t).

7. The electronic component of claim 3, wherein said reflector structure is an in-line reflector structure.

8. The electronic component of claim 3, wherein: said reflector structure is a 90° reflector structure.

9. The electronic component of claim 1, wherein: all sub-groups whose finger edges are displaced by $\Delta Z_i$ have complete fingers.

10. The electronic component of claim 1, wherein: the $\Delta Z_i$ displacement of the finger edges of the individual sub-groups corresponding to the finger weighting is superimposed on a finger arrangement which corresponds to a digital structure having dispersion.

11. The electronic component of claim 1, wherein: the respective displacement $\Delta Z_i$ of the finger edges of the individual sub-groups relative to the center of the appertaining principal group is superimposed on equidistant intervals of the centers of successive principal groups.

12. The electronic component of claim 1, wherein in case of adjacent sub-groups being displaced towards one another at least one of such sub-groups comprises at least one virtual finger in their adjacent areas.

13. The electronic component of claim 1, wherein in case of principal groups with an even number of sub-groups the oscillation of said additional phase modulation b(t) is such that the number of complete oscillations within a respective principal group is equal to half the number of real sub-groups of the respective principal group.

14. The electronic component of claim 1, wherein each sub-group comprises an even number of real finger edges.

15. The electronic component of claim 1, wherein all fingers of said sub-groups having equal length.

16. The electronic component of claim 1, wherein all interdigital fingers of said sub-groups having equal length of the overlap (apodization).

* * * * *